United States Patent

Saitoh et al.

[11] 4,056,787
[45] Nov. 1, 1977

[54] SELF-OSCILLATING MIXER CIRCUIT

[75] Inventors: Takeshi Saitoh; Eisaku Akutsu; Mitsuhisa Shinagawa, all of Yokohama, Japan

[73] Assignee: Hitachi, Ltd., Japan

[21] Appl. No.: 691,086

[22] Filed: May 28, 1976

[30] Foreign Application Priority Data

May 30, 1975 Japan .................. 50-64266
May 30, 1975 Japan .................. 50-64267

[51] Int. Cl.$^2$ .......................... H04B 1/06
[52] U.S. Cl. .................. 331/59; 325/317; 325/443; 325/461; 325/491; 331/177 V
[58] Field of Search .................. 331/58, 59, 177 V; 325/317, 491, 458, 461, 318, 319, 492, 442, 443, 459; 330/40

[56] References Cited

U.S. PATENT DOCUMENTS

| 3,210,566 | 10/1965 | Rainer | 325/317 |
| 3,376,510 | 4/1968 | Rümmer | 325/459 |
| 3,624,509 | 11/1971 | Morici | 325/458 |

FOREIGN PATENT DOCUMENTS 2,134,351  1/1973  Germany .................. 325/456

Primary Examiner—John Kominski
Attorney, Agent, or Firm—Craig & Antonelli

[57] ABSTRACT

A self-oscillating mixer circuit suitable for a television receiver is provided using characteristically a single or two switching diodes. During VHF receiving, the mixer circuit operates in a self-oscillating mixing mode under an optimum bias condition, while, during UHF receiving, it operates under an optimum bias condition for intermediate frequency amplification, ceasing its local oscillation.

4 Claims, 6 Drawing Figures

SELF-OSCILLATING MIXER CIRCUIT

This invention relates to a self-oscillating mixer circuit operable as a combination of a self-oscillating mixer and an intermediate amplifier.

The self-oscillating mixer circuit of this invention is suitable for use in, for example, the tuner of a television receiver.

In the tuner used for the television receiver, the mixer for frequency conversion is often used just as an amplifier. An example of such a case is that the mixer circuit of VHF is used as an intermediate frequency amplifier in UHF receiving. In this case, when it is operated in the intermediate frequency amplifying mode, its local oscillation must be stopped so as to prevent the mixing operation.

In the case of a conventional mixer circuit employing the separate-oscillating mixing method, its local oscillation may easily be stopped by disconnecting it from the power source for driving active components of the local oscillating circuit. On the other hand, in the case of the self-oscillating mixing method, the same active component is used for both the mixing and local oscillating operations. If the local oscillation is stopped by such a conventional way, the amplification function of the mixing circuit also is damaged so that it can not function as the intermediate amplifier. More specifically, in the conventional self-oscillating mixer circuit, its local oscillation must be stopped in connecting the drive power source with the active components of the circuit. For this, an additional intermediate frequency amplifier is needed without using the self-oscillating mixer circuit as the intermediate frequency amplifier. This leads to complexity of circuit construction, reduction of production rate, and expensiveness of cost.

Accordingly, an object of the present invention is to provide a self-oscillating mixer circuit operable as a combination of an intermediate frequency amplifier and a self-oscillating mixer.

Another object of the present invention is to provide a self-oscillating mixer circuit permitting a stable self-oscillating mixing operation with a simple circuit construction.

According to the present invention, there is provided a self-oscillating mixer circuit characteristically using a single or two switching diodes for establishing an optimum bias condition. During VHF receiving, the mixer circuit operates in a self-oscillating mixing mode under an optimum bias condition, while, during UHF receiving, it operates under the bias condition most suitable for intermediate frequency amplification, ceasing its local oscillation.

Further, the self-oscillating mixer circuit of this invention is featured by such a construction that there is provided a feedback circuit for oscillation being common to the respective receiving frequency bands, and the DC bias voltage of the transistor is selected through means of a single resistor or a combination of a resistor and a switching diode so as to be optimum to the respective receiving frequency bands.

Other objects and features of the present invention will be apparant from the following description in connection with the accompanying drawings.

The invention will be described in detail with reference to embodiments depicted in the accompanying drawings.

Figure 1:
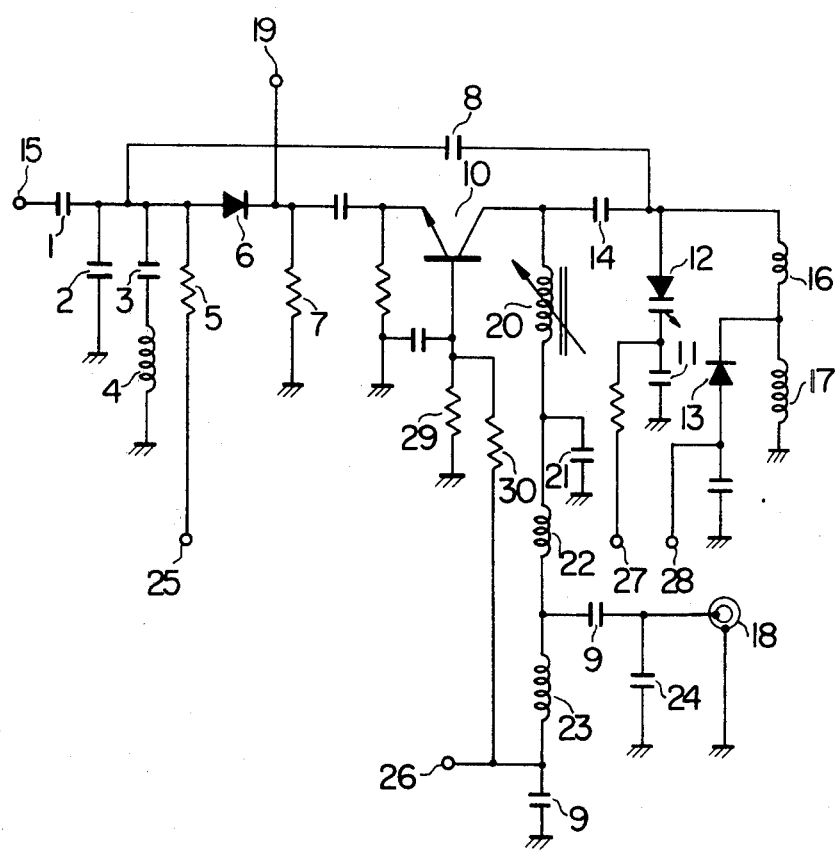
FIG. 1 is a circuit diagram of an embodiment of a self-oscillating mixer circuit according to the present invention.

Referring now to FIG. 1, there is shown an embodiment of a self-oscillating mixer circuit used in a VHF tuner for high frequency components and low frequency components, according to the invention. In the figure, a transistor 10 is an active component used in common base fashion for self-oscillating mixing and intermediate frequency amplifying. A coil 16 for high frequency components, a coil 17 for low frequency components, a diode 12 for tuning, and a capacitor 11 constitute a resonance circuit. A positive or negative voltage is applied to a terminal 28 for turning on or off a switching diode 13. Depending on the on or off operation of the switching diode, the resonance circuit resonates with the high frequency or low frequency components of the local oscillation frequency band. The oscillation frequency is controlled by changing the positive voltage applied to a terminal 27 which in turn changes the junction capacitance of the tuning diode 12. The resonance circuit is coupled with the collector of the transistor 10 via a capacitor 14. A terminal 15 is an RF input terminal, and a capacitance 1 a coupling capacitor for an in-between stage tuning circuit. Capacitors 2 and 8 constitute a feedback circuit of the oscillation circuit. A capacitance 3 and a coil 4 constitute an IF trap for damping an intermediate frequency. A diode 6 is made conductive or nonconductive by appying a positive or negative voltage to a terminal 25 or by opening the terminal 25, in association with resistors 5 and 7. A terminal 19 is an input terminal for the intermediate frequency to be amplified during UHF receiving. The intermediate frequency signal being frequency-converted or amplified is obtained from an intermediate frequency output terminal 18, through the collector of the transistor 10, an intermediate frequency tuning circuit including a variable inductor 20 and a capacitance 21, and a low pass filter circuitry consisting of a coil 22, a capacitance 9, and a capacitance 24. A coil 23 is a choke coil for blocking the intermediate frequency. A positive voltage being consistently applied to a terminal 26 is fed to the collector of the transistor 10 through the coil 23, the coil 22, and the variable inductor 20, and to the base of the transistor 10 through resistors 29 and 30, for driving the transistor 10.

During VHF receiving, a positive voltage is applied to the terminal 25 thereby to make the switching diode 6 conductive. Upon the conduction of the diode 6, the feedback path and the IF trap are coupled with the emitter of the transistor 10, causing the transistor 10 to operate in oscillation and mixing mode. That is, at this time, a self-oscillating mixer circuit is established.

During UHF receiving, a negative voltage is applied to the terminal 25 or nothing applied thereto for turning off the switching diode 6. Upon the turning-off of the transistor 10, the oscillation feedback path and the IF trap are disconnected from the emitter. Then, the intermediate frequency signal the UHF tuner is inputted from the input terminal 19 for the intermediate frequency signal. That is, an intermediate frequency amplifier is formed.

Figure 2:
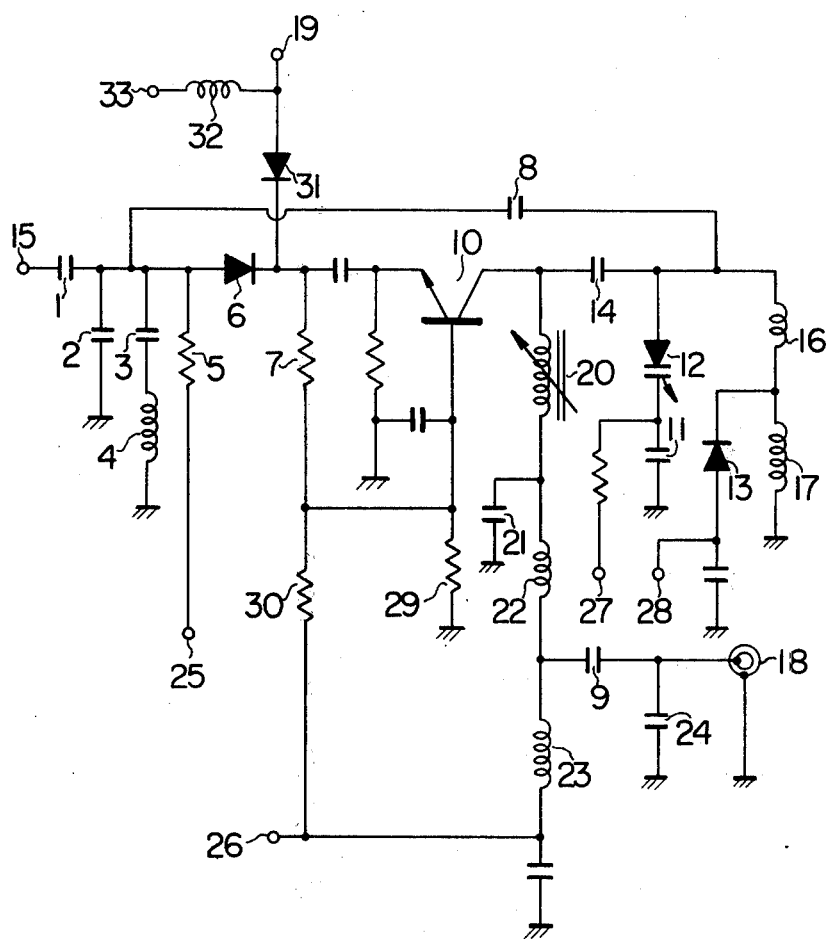
FIG. 2 is a circuit diagram of another embodiment of this invention.

Turning now to FIG. 2, there is shown another embodiment of the invention in which a group of resistors for establishing the base voltage for the transistor 10 shown in FIG. 1 are replaced by resistors 7, 30 and 29 rearranged in connection. In the FIG. 2 circuit, there is provided additionally a switching diode 31, a coil 32, and a power source terminal 33, those being connected to the terminal 19. The power source terminal 33 receives a negative voltage or is opened during VHF receiving, while it receives a positive voltage during UHF receiving.

During VHF receiving time, the terminal 25 receives a positive voltage, while the terminal 33 is opened or receives a negative voltage. The result is that the intermediate frequency signal path of the UHF tuner is cut off and the base voltage of the transistor 10 is determined by the voltages applied to the terminals 25 and 26, the voltage drops across the resistor 5 and the switching diode 6, and the resistors 7, 29 and 30. The circuit under consideration is conditioned for the self-oscillating mixing operation.

During UHF receiving time, a negative voltage is applied to the terminal 25 so that the feedback path for oscillation and the intermediate frequency trap are electrically separated. A positive voltage applied to the terminal 33 causes the switching diode 31 to be conductive. The base voltage of the transistor 10 is determined by the voltages applied to the terminals 26 and 33, the voltage drop across the switching diode 31, and the resistors 7, 29, and 30. In this manner, the circuit under discussion is conditioned for the intermediate frequency amplifying operation.

It is to be noted that the switching diode 31, the coil 32, and the power source terminal 33 connected to the intermediate frequency signal input terminal 19 are not indispensable, and, even without those components, the DC bias voltage to the transistor may be switched.

As seen from the foregoing, in the self-oscillating mixer circuit according to the invention, the use of a single or two switching diodes permits it to execute the self-oscillating mixer operation under an optimum bias condition when in a VHF receiving mode, while to execute it to operate in the intermediate frequency amplifying mode under an optimum bias condition, ceasing the local oscillation, when in a UHF receiving mode.

Figure 3:
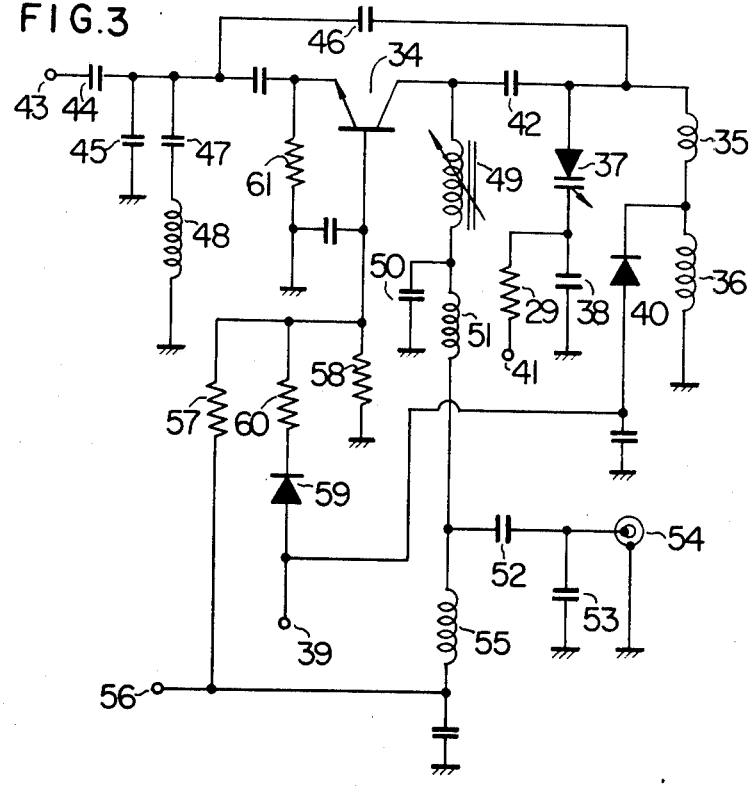
FIG. 3 is a circuit diagram of another self-oscillating mixer circuit for stabilizing a self-oscillating mixing operation.

Reference is made to FIG. 3 illustrating a self-oscillating mixer circuit for the VHF tuner having high frequency components and low frequency components in which the oscillation feedback path is common to the respective receiving frequency bands and the bias condition for the active component is switched every frequency band so as to provide an optimum condition to the respective one, for purpose of securing a stable self-oscillating mixer operation. A high frequency band coil 35, a low frequency band coil 36, a tuning diode 37, and a capacitor 38 constitute a resonance circuit. A positive or negative voltage is applied to the terminal 39. Upon reception of the positive or negative voltage, the switching diode 40 is turned on or off. Depending on this on or off operation of the switching diode, the resonance circuit resonates with low frequency and high frequency components of the local oscillation frequency band. The frequency of the local oscillation is controlled by changing the positive voltage applied to the terminal 41 which in turn changes the junction capacitance of the tuning diode 37. This resonance circuit is connected to the collector through the capacitor 42. A terminal 43 is an RF input terminal, and a capacitor 44 is a coupling capacitor with an in-between stage tuning circuit. Capacitors 45 and 46 determine a feedback quantity in the oscillation circuit. A capacitor 47 and a coil 48 constitute an IF trap for damping the intermediate frequency. The intermediate frequency signal being frequency converted or amplifier is outputted from an intermediate frequency output terminal 54 after passing a route of the collector of the transistor 34, an intermediate frequency tuning circuit, a coil 51, a DC blocking capacitor 52, and a low pass filter consisting of a capacitor 53. A coil 55 is a choke coil for blocking the intermediate frequency. A positive voltage being constantly applied to the terminal 56 is fed to the collector of the transistor 34 through a choke coil 55, a coil 51, and a variable inductor 49, for power supply to the collector. Further, this voltage is fed to the base of the transistor through resistors 57 and 58. This voltage contributes to formation of the DC bias voltage, together with the band switching voltage given to the terminal 39 via a switching diode 59 and a resistor 60. The switching diode 59 is unnecessary when the power source terminal 39 receives a negative voltage or is opened for a low frequency band receiving.

Figure 4:
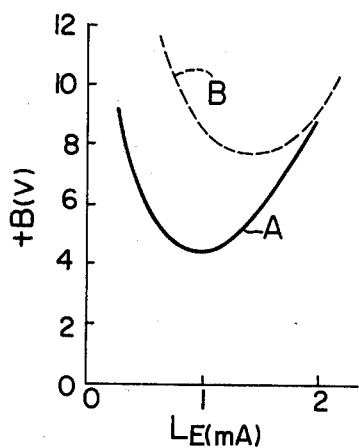
FIG. 4 is a graph illustrating the relationship of a drive current $I_E$ of the transistor with respect to a power source voltage $+B$ initiating oscillation in the circuit of FIG. 3.
Figure 5:
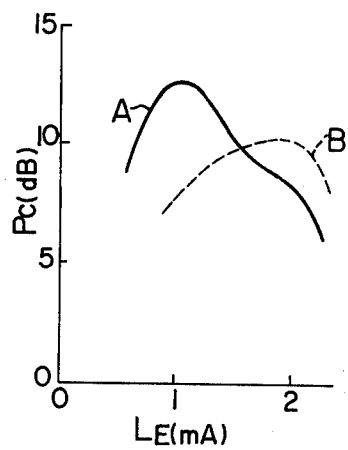
FIG. 5 illustrates a characteristic curve of the relationship of the conversion gain ($P_c$) with respect to the drive current ($I_E$)

FIG. 4 illustrates the relationship between the DC drive current ($I_E$) of the transistor (34) and the oscillation initiating voltage (+B) applied to the power source terminal 56 as shown in FIG. 3. As seen from the graph of FIG. 4, the minimum of the oscillation initiating voltage (+B) implying the best oscillation condition, is located at 1 mA on the $I_E$ current scale for the low frequency band (A) and at 1.5 mA for the high frequency band (B). From FIG. 5 illustrating the relationship of the DC drive current ($I_E$) vs. the conversion gain ($P_c$), it is seen that the maximum conversion gain is obtained at 1 mA of $I_E$ for the low frequency band (A) and at 1.5 to 2 mA for the high frequency band (B). The characteristic curves in FIGS. 4 and 5 indicate that the drive current must be changed every frequency band in order to provide a stable self-oscillating mixing operation in the respective receiving frequency bands.

In the embodiment in FIG. 3, when in the frequency band receiving, the power source terminal 39 remains opened or receives a negative voltage, so that the switching diode 59 is nonconductive. The DC bias voltage to the transistor 10 base depends on the voltage applied on the power source terminal 56, and resistors 57 and 58, and it is established so as to provide a stable self-oscillating mixing operation in low frequency band. In high frequency band receiving, a positive voltage is applied to the power source terminal 39 so that the switching diode 59 is conductive. The bias voltage to the base of the transistor depends on the voltage at the power source terminal 56, the voltage at the power source terminal 39, the resistors 57, 58, 60 and the voltage drop across the switching diode 59. At this time, the bias voltage is so established as to provide a self-oscillating mixing operation. At this time, the DC bias voltage to the base is higher than that at the frequency receiving and thus the drive current of the transistor 34 also is larger. As described above, in the circuit of FIG. 4, without using a complex circuit employing oscillation feedback paths for respective receiving frequency bands, a single feedback path is employed common to the different receiving frequency bands, and, through means of a single resistor and a combination of a resistor and a switching element, the DC bias to the active element is switched so as to be optimum to the different receiving frequency bands, thereby providing a self-oscillating mixer circuit with a stable operation.

Figure 6:
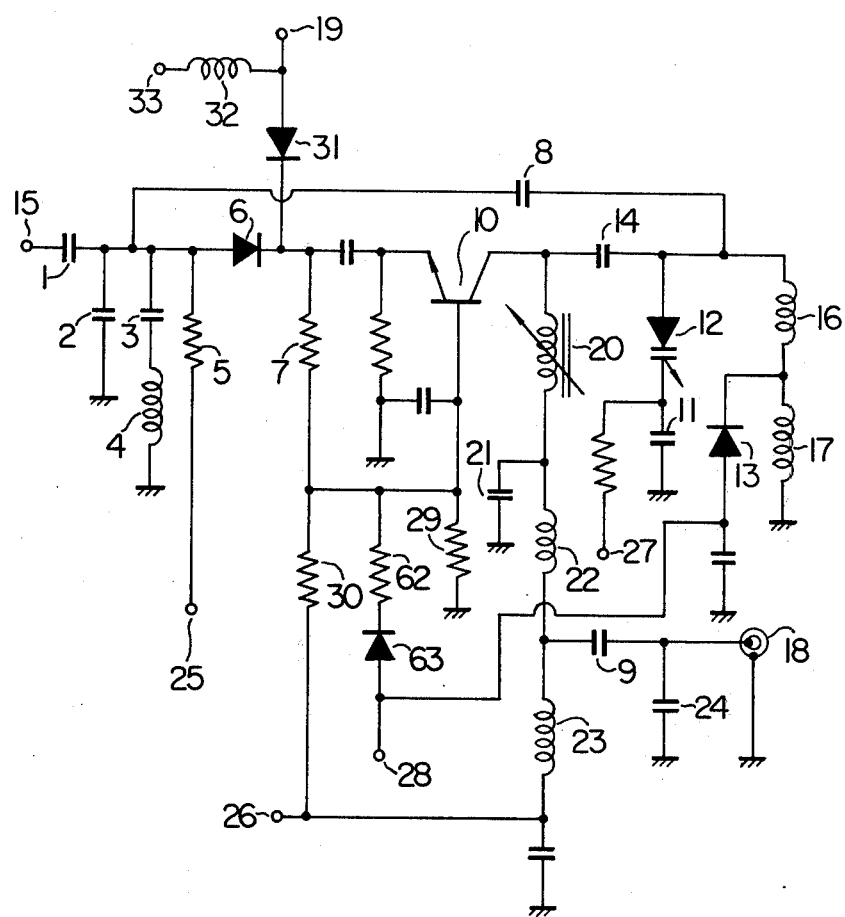
FIG. 6 is a circuit diagram of still another embodiment of this invention.

FIG. 6 is a modification of the FIG. 2 embodiment in which the base of the transistor 10 is connected to the power source terminal 28, through a resistor 62 and a switching diode 63.

In this embodiment, a self-oscillating mixing operation, an intermediate frequency amplifying operation, and the self-oscillating mixing operation for high and low frequency band coils may be stably performed.

What is claimed is:

1. A self-oscillating mixer circuit comprising:
   a first input terminal;
   a first switching diode connected to said first input terminal at one end thereof;
   a self-oscillating mixing transistor connected at its emitter to the other end of said first switching diode and grounded at its base;
   a feedback circuit for oscillation connected between the collector of said transistor and said one end of the first switching diode;
   an intermediate frequency damping circuit connected between said input terminal and ground;
   a second input terminal connected to said other end of the first switching diode;
   a first bias voltage source connected to said one end of the first switching diode, for rendering said first switching diode conductive and nonconductive;
   means for rendering said first switching diode conductive by applying a voltage of said first bias voltage source to said first switching diode so as to allow said transistor to effect a self-oscillating mixing operation; and
   means for rendering said first switching diode nonconductive by changing the voltage of said first bias voltage source applied to said first switching diode, and disconnecting said oscillation feedback circuit and said intermediate frequency damping circuit from the emitter of said transistor so as to allow said transistor to effect an intermediate frequency amplifier operation.

2. A self-oscillating mixer circuit according to claim 1, wherein the voltage of said first bias voltage source is applied to the base of said transistor through a resistor when said switching diode is in a conductive state, and the base voltage of said transistor operating as a self-oscillating mixer is changed in the intermediate frequency amplifier operation thereof.

3. A self-oscillating mixer circuit according to claim 1, wherein said circuit further comprises a bias voltage source for changing over a frequency band, a second switching diode, a swtiching circuit with a series-connected resistor, and means for connecting said bias voltage source and the base of said transistor to said swtiching circuit, whereby the bias voltage applied to said transistor is changed from a first voltage level for high band reception to a second voltage level for low band reception so as to provide an optimim and stable oscillating mixing operation for said high and low band reception.

4. A self-oscillating mixer circuit comprising:
   a first input terminal;
   a first switching diode connected to said first input terminal at one end thereof;
   a self-oscillating mixing transistor connected at its emitter to the other end of said first switching diode and grounded at its base;
   a feedback circuit for oscillation connected between the collector of said transistor and said one end of the first switching diode;
   an intermediate frequency damping circuit connected between said first input terminal and ground;
   a second input terminal connected to the cathode of said first switching diode;
   a first bias voltage source connected to said first switching diode for rendering said first switching diode conductive and nonconductive;
   means for rendering said first switching diode conductive by applying a voltage of said first bias voltage source to said first switching diode thereby to allow said transistor to effect a self-oscillating operation;
   means for rendering said first switching diode nonconductive by changing the voltage of said first bias voltage source applied to said first switching diode, and disconnecting said oscillation feedback circuit and said intermediate frequency damping circuit from the emitter of said transistor thereby to allow said transistor to effect an intermediate frequency amplifier operation;
   means for applying a voltage of said first bias voltage source to the base of said transistor when said first switching diode is in a conductive state, and changing the voltage applied to said base when the operation of said transistor is changed over between a self-oscillating mixing operation and an intermediate frequency amplifier operation;
   a second bias voltage source for changing over a frequency band;
   a switching circuit connected in series with a second switching diode and a resistor;
   means for connecting to said switching circuit said second bias source and the base of said transistor to thereby change over the bias voltage applied to said transistor when the band reception is changed over between high band reception and low band reception.

* * * * *